(12) United States Patent
Dodoc

(10) Patent No.: US 9,036,772 B2
(45) Date of Patent: May 19, 2015

(54) MIRROR FOR THE EUV WAVELENGTH RANGE, PROJECTION OBJECTIVE FOR MICROLITHOGRAPHY COMPRISING SUCH A MIRROR, AND PROJECTION EXPOSURE APPARATUS FOR MICROLITHOGRAPHY COMPRISING SUCH A PROJECTION OBJECTIVE

(75) Inventor: Aurelian Dodoc, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 498 days.

(21) Appl. No.: 12/756,456

(22) Filed: Apr. 8, 2010

(65) Prior Publication Data

US 2010/0265480 A1    Oct. 21, 2010

(30) Foreign Application Priority Data

Apr. 15, 2009   (DE) .......................... 10 2009 017 096

(51) Int. Cl.
| | | |
|---|---|---|
| *G02B 1/10* | (2006.01) | |
| *G02B 17/06* | (2006.01) | |
| *G02B 5/08* | (2006.01) | |
| *G03F 7/20* | (2006.01) | |

(52) U.S. Cl.
CPC .......... *G02B 17/0657* (2013.01); *G02B 5/0891* (2013.01); *G03F 7/70316* (2013.01); *G03F 7/70958* (2013.01)

(58) Field of Classification Search
None
See application file for complete search history.

(56) References Cited

U.S. PATENT DOCUMENTS

| | | | |
|---|---|---|---|
| 6,295,164 B1 * | 9/2001 | Murakami et al. ............ 359/584 |
| 6,396,900 B1 | 5/2002 | Barbee, Jr. et al. | |
| 7,474,733 B1 | 1/2009 | Yamamoto | |
| 7,920,323 B2 * | 4/2011 | Benoit et al. ................... 359/359 |
| 2003/0008180 A1 * | 1/2003 | Bajt et al. ....................... 428/698 |
| 2005/0270648 A1 | 12/2005 | Sekine | |
| 2009/0009858 A1 * | 1/2009 | Feigl et al. ..................... 359/359 |

OTHER PUBLICATIONS

Office Action in corresponding Taiwanese Application No. 99111580, mailed Sep. 1, 2014, along with an English translation.

* cited by examiner

*Primary Examiner* — Hoon Song
(74) *Attorney, Agent, or Firm* — Edell, Shapiro & Finnan, LLC

(57) ABSTRACT

A mirror for the EUV wavelength range (1) having a layer arrangement (P) applied on a substrate (S), the layer arrangement having a periodic sequence of individual layers, where the periodic sequence has at least two individual layers—forming a period—composed respectively of silicon (Si) and ruthenium (Ru). Also disclosed are a projection objective for microlithography (2) including such a mirror, and a projection exposure apparatus for microlithography having such a projection objective (2).

11 Claims, 9 Drawing Sheets

MIRROR FOR THE EUV WAVELENGTH RANGE, PROJECTION OBJECTIVE FOR MICROLITHOGRAPHY COMPRISING SUCH A MIRROR, AND PROJECTION EXPOSURE APPARATUS FOR MICROLITHOGRAPHY COMPRISING SUCH A PROJECTION OBJECTIVE

The following disclosure is based on German Patent Application No. DE 10 2009 017 096.0, filed on Apr. 15, 2009, which is incorporated into the present application by reference.

FIELD OF AND BACKGROUND OF THE INVENTION

The invention relates to a mirror for the EUV wavelength range. Furthermore, the invention relates to a projection objective for microlithography comprising such a mirror. Moreover, the invention relates to a projection exposure apparatus for microlithography comprising such a projection objective.

Projection exposure apparatuses for microlithography for the EUV wavelength range have to rely on the fact that the mirrors utilized for the exposure or for the imaging of a mask into an image plane have a high reflectivity since, firstly, the product of the reflectivity values of the individual mirrors determines the total transmission of the projection exposure apparatus and since, secondly, EUV light sources are limited in terms of their light power.

Mirrors for the EUV wavelength range around 13 nm having high reflectivity values are known for example from U.S. Pat. No. 7,474,733 B1. The mirrors shown in U.S. Pat. No. 7,474,733 B1 have high theoretical reflectivity values for multiple coatings, wherein the multiple coatings for the highest reflectivity values comprise more than 30 identical periods of silicon and ruthenium layers (Ru/Si-multilayer).

What is disadvantageous about these mirrors, however, is that said theoretical reflectivity values cannot be achieved in practice since alternating layers composed of silicon and ruthenium tend toward interdiffusion, whereby a loss of contrast occurs at the transition of the layers, which in turn leads to a reduction of the reflectivity.

Interdiffusion barriers that can prevent such mixing of different materials are known in connection with different chemical elements than silicon and ruthenium, from U.S. Pat. No. 6,396,900 B1. In this case, U.S. Pat. No. 6,396,900 B1 proposes, in order to obtain maximum reflectivities, using very thin barrier layers of less than 0.35 nm thickness since these barrier layers generally have an absorbent effect at a wavelength around 13 nm.

Furthermore, US 2005/0270648 discloses mirrors for the EUV wavelength range around 13 nm for angles of incidence of up to 20°, which mirrors comprise so-called Mo/Si multiple coatings (Mo/Si multilayer).

OBJECTS AND SUMMARY OF THE INVENTION

It is an object of the invention, therefore, to provide a mirror for the EUV wavelength range, comprising silicon and ruthenium layers, which ensures the high theoretical reflectivity values of such layers in practice as well.

In particular, the object of the invention is to provide such a mirror which ensures the high reflectivity values even for different angles of incidence with at the same time high variation of the angle of incidence for a wavelength of between 13.3 nm and 13.7 nm.

According to the invention, this object is achieved by means of a mirror for the EUV wavelength range having a layer arrangement applied on a substrate, said layer arrangement comprising a periodic sequence of individual layers, wherein the periodic sequence comprises at least two individual layers—forming a period—composed of silicon and ruthenium, wherein at least one barrier layer composed of $B_4C$ having a thickness of greater than 0.35 nm, in particular greater than 0.4 nm, is situated between the individual layers composed of silicon and ruthenium.

It has been recognized according to the invention that a barrier layer composed of $B_4C$ is necessary for preventing the interdiffusion of silicon and ruthenium and at the same time, for optical reasons, must have a minimum thickness of greater than 0.35 nm since otherwise high reflectivity values do not result for different angles of incidence.

Advantageously, the mirror for the EUV wavelength range should in this case have a barrier layer composed of $B_4C$ having a thickness of less than 1 nm, preferably less than 0.8 nm, particularly preferably less than 0.6 nm, since, for larger layer thicknesses of the barrier layer, the high reflectivity values obtained by the barrier layer B decrease again on account of the absorbent effect of the layers at 13 nm.

It is particularly advantageous, for production engineering reasons, if always in each case an identically thick barrier layer composed of $B_4C$ having a thickness of between 0.4 nm and 0.6 nm is situated between the individual layers composed of silicon and ruthenium, since rearrangements of coating processes or coating apparatuses can then be avoided.

Likewise advantageously, the individual layers composed of silicon should have a thickness of between 4 nm and 7 nm and the individual layers composed of ruthenium should have a thickness of between 2.5 nm and 4.5 nm. Furthermore, a covering layer system should terminate the layer arrangement of the mirror and in this case comprise at least one layer composed of a chemically inert material, in order to protect the mirror against ambient influences and the resultant losses of reflectivity.

Furthermore, the object of the invention is achieved by means of a projection objective comprising at least one mirror according to the invention.

Further advantageous configurations of a mirror according to the invention and of a projection objective according to the invention emerge from the features of the dependent claims.

Moreover, the object of the invention is achieved by means of a projection exposure apparatus according to the invention for microlithography comprising such a projection objective.

BRIEF DESCRIPTION OF THE DRAWINGS

Exemplary embodiments of the invention are explained in more detail below with reference to the figures, in which.

DETAILED DESCRIPTION OF THE EXEMPLARY EMBODIMENTS

Figure 1:
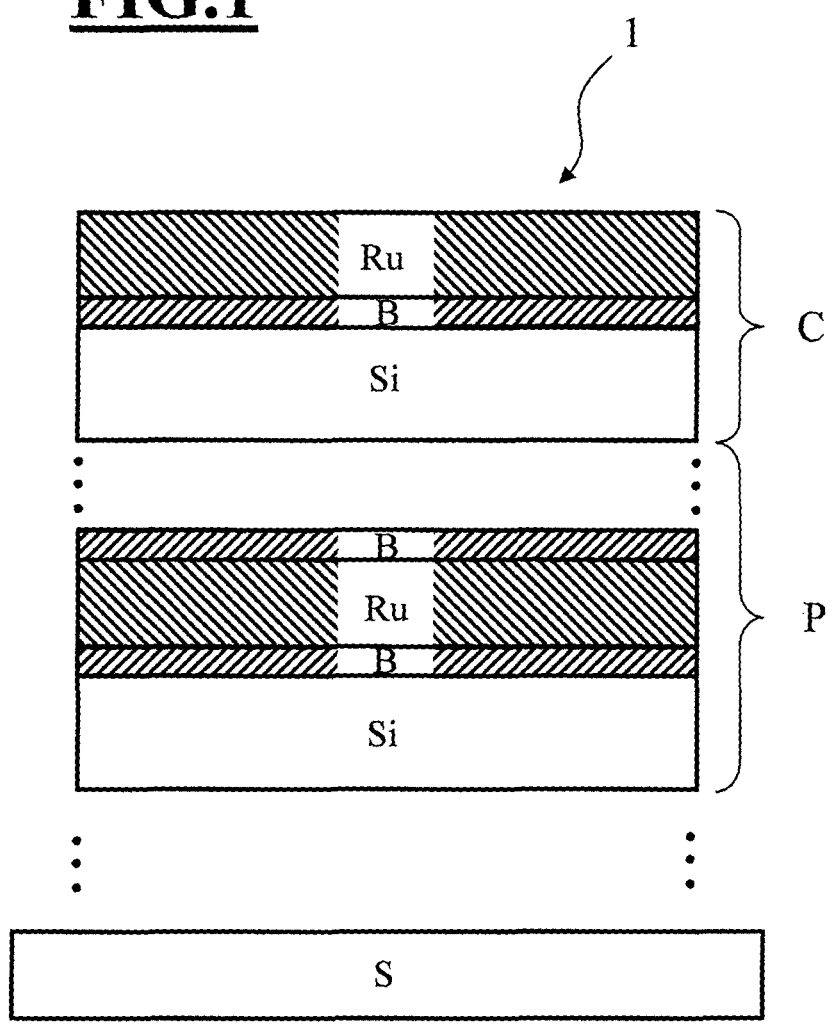
FIG. 1 shows a schematic illustration of a mirror according to the invention.

FIG. 1 shows a schematic illustration of a mirror 1 according to the invention for the EUV wavelength range having a layer arrangement P applied on a substrate S, said layer arrangement comprising a periodic sequence of individual layers, wherein the periodic sequence comprises at least two individual layers—forming a period—composed of silicon Si and ruthenium Ru, and wherein at least one barrier layer B composed of $B_4C$ having a thickness of greater than 0.35 nm, in particular greater than 0.4 nm, is situated between the individual layers composed of silicon Si and ruthenium Ru. In this case, the layer arrangement P can comprise up to 100 periods of the Ru/Si individual period illustrated. Furthermore, between the layer arrangement P and the substrate S an interlayer or an interlayer arrangement can be provided, which serves for the stress compensation of the layer arrangement. The layer arrangement P of the mirror 1 is terminated in FIG. 1 by a covering layer system C comprising at least one layer composed of a chemically inert material such as e.g. Rh, Pl, Pd, Ru, Au, $SiO_2$, etc. as a terminating layer. For layer thicknesses of the silicon layers Si and ruthenium layers Ru such as are indicated in the exemplary embodiments containing FIGS. 6 to 9, the reflectivity of such a mirror 1 illustrated over the exit pupil of the central field point of the projection objective 2, has more than 30% over all locations of the exit pupil, see FIGS. 6 to 9. In this case, the reflectivity values of more than 50% over the entire exit pupil of the central field point are possible for the exemplary embodiment according to FIG. 6. In the exemplary embodiments according to FIGS. 7 to 9, such reflectivity values are possible only for partial regions of the exit pupil. Said partial regions comprise the edge of the exit pupil, however, which is highly important for imaging theory in lithography. Preferably, the mirror 1 for the EUV wavelength range should have a barrier layer B composed of $B_4C$ having a thickness of less than 1 nm, preferably less than 0.8 nm, particularly preferably less than 0.6 nm, since, in the case of larger layer thicknesses of the barrier layer B, the advantages in terms of the reflectivity which are achieved by means of the barrier layer B decrease again.

Figure 2:
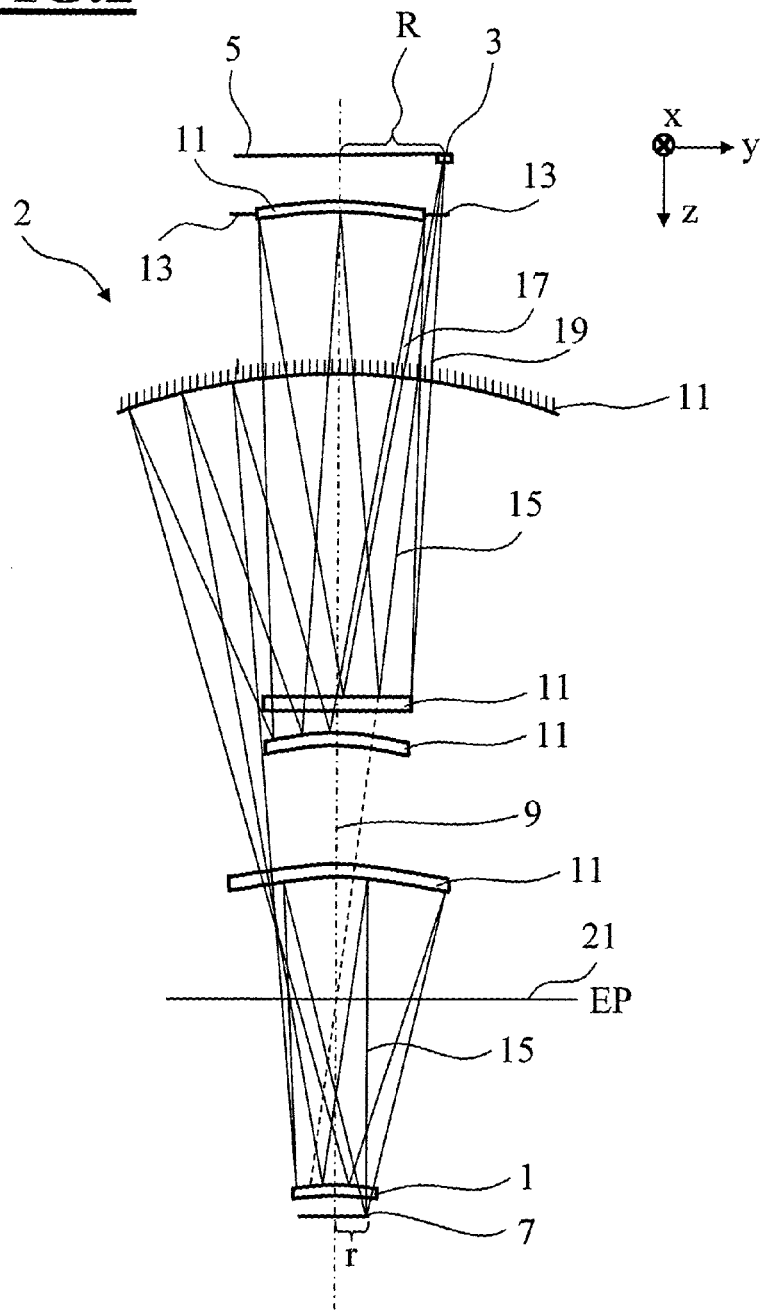
FIG. 2 shows a schematic illustration of a projection objective according to the invention for a projection exposure apparatus for microlithography.

FIG. 2 shows a schematic illustration of a projection objective 2 according to the invention for a projection exposure apparatus for microlithography having six mirrors 1, 11, including at least one mirror 1 according to the invention. The task of a projection exposure apparatus for microlithography is to image the structures of a mask, which is also referred to as a reticle, lithographically onto a so-called wafer in an image plane. For this purpose, a projection objective 2 according to the invention in FIG. 2 images an object field 3, which is arranged in the object plane 5, into an image field in the image plane 7. The structure-bearing mask, which is not illustrated in the drawing for the sake of clarity, can be arranged at the location of the object field 3 in the object plane 5. For orientation purposes, FIG. 2 illustrate a system of Cartesian coordinates, the x axis of which points into the plane of the figure. In this case, the x-y coordinate plane coincides with the object plane 5, the z axis being perpendicular to the object plane 5 and pointing downward. The projection objective has an optical axis 9, which does not run through the object field 3. The mirrors 1, 11 of the projection objective 2 have a design surface that is rotationally symmetrical with respect to the optical axis. In this case, said design surface must not be confused with the physical surface of a finished mirror, since the latter surface is trimmed relative to the design surface in order to ensure passages of light past the mirror. In this exemplary embodiment, the aperture diaphragm 13 is arranged on the second mirror 11 in the light path from the object plane to the image plane. The effect of the projection objective 2 is illustrated with the aid of three rays, a principal ray 15 and the two aperture marginal rays 17 and 19, all of which originate in the center of the object field 3. The principal ray 15, which runs at an angle of 6° with respect to the perpendicular to the object plane, intersects the optical axis 9 in the plane of the aperture diaphragm 13. As viewed from the object plane 5, the principal ray 15 appears to intersect the optical axis in the entrance pupil plane 21. This is indicated in FIG. 2 by the dashed extension of the principal ray 15 through the first mirror 11. Consequently, the virtual image of the aperture diaphragm 13, the entrance pupil, lies in the entrance pupil plane 21. The exit pupil of the projection objective could likewise be found with the same construction in the backward extension of the principal ray 15 proceeding from the image plane 7. However, in the image plane 7 the principal ray 15 is parallel to the optical axis 9, and from this it follows that the backward projection of these two rays produces a point of intersection at infinity in front of the projection objective 2 and the exit pupil of the projection objective 2 is thus at infinity. Therefore, this projection objective 2 is a so-called objective that is telecentric on the image side. The center of the object field 3 is at a distance R from the optical axis 9 and the center of the image field 7 is at a distance r from the optical axis 9, in order that no undesirable vignetting of the radiation emerging from the object field occurs in the case of the reflective configuration of the projection objective.

Figure 3:
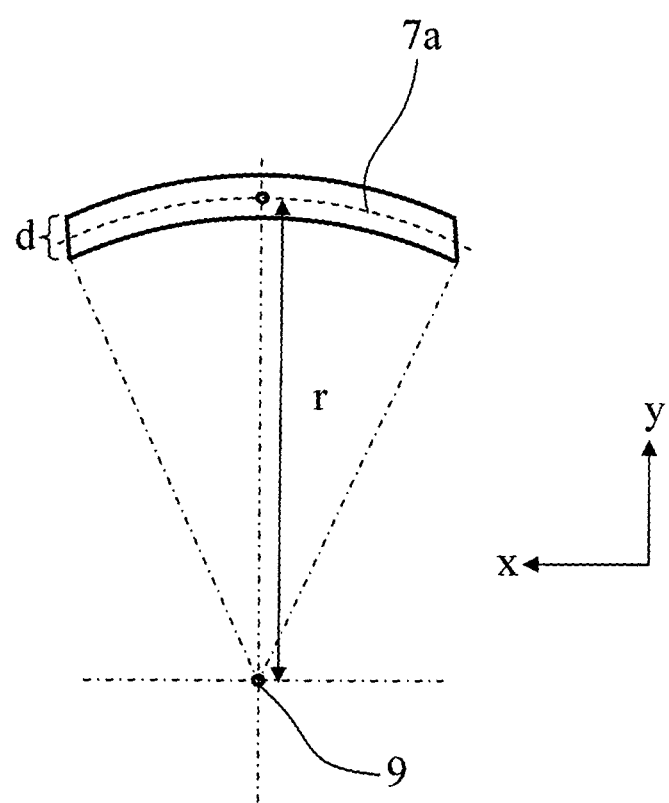
FIG. 3 shows a schematic illustration of the image field of the projection objectives.

FIG. 3 shows a plan view of an arcuate image field 7a such as occurs in the projection objective 2 illustrated in FIG. 2, and a system of Cartesian coordinates, the axes of which correspond to those from FIG. 2. The image field 7a is a sector from an annulus, the center of which is through the point of intersection of the optical axis 9 with the object plane. The average radius r is 34 mm in the case illustrated. The width of the field in the y direction d is 2 mm here. The central field point of the image field 7a is marked as a small circle within the image field 7a. As an alternative, a curved image field can also be delimited by two circle arcs which have the same radius and are displaced relative to one another in the y direction. If the projection exposure apparatus is operated as a scanner, then the scanning direction runs in the direction of the shorter extent of the object field, that is to say in the direction of the y direction.

Figure 4:
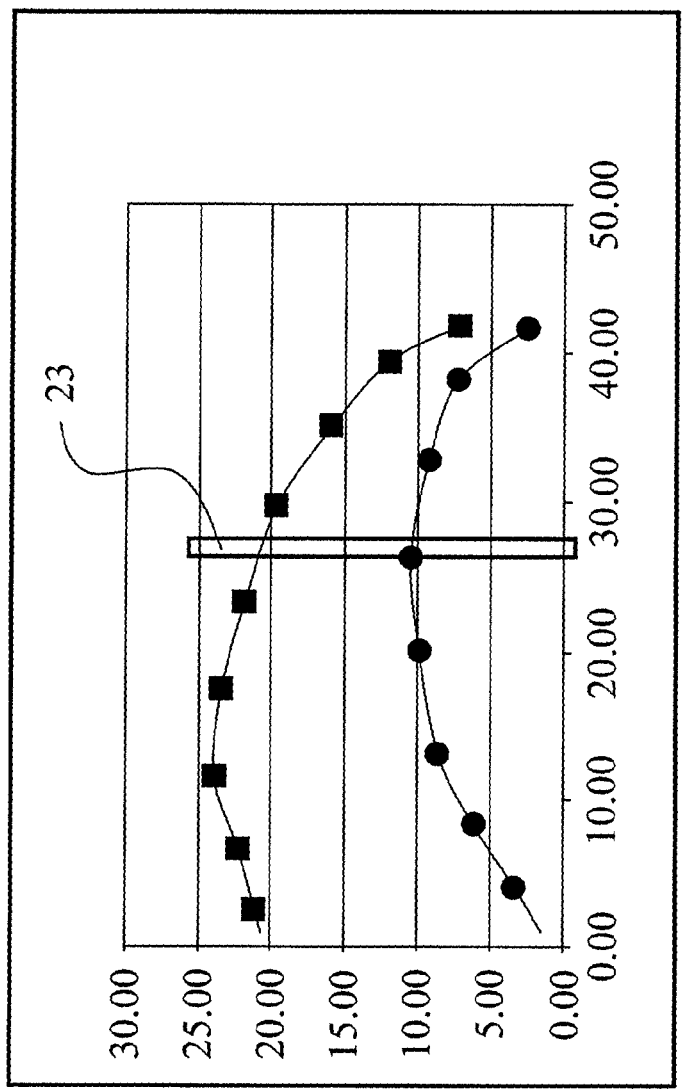
FIG. 4 an exemplary illustration of the maximum angles of incidence and of the angle-of-incidence interval against the distance between the locations of a mirror according to the invention and the optical axis within a projection objective.

FIG. 4 shows an exemplary illustration of the maximum angles of incidence (rectangles) and of the angle-of-incidence intervals (circles) in the unit [°] against different radii or distances between the locations and the optical axis, indicated in the unit [mm], of the penultimate mirror 1 in the light path from the object plane 5 to the image plane 7 of the projection objective 2 from FIG. 2. Said mirror 1, in the case of a projection objective for microlithography 2 which has six mirrors for the EUV wavelength range 1, 11, is generally that mirror which has to ensure the largest angles of incidence and the largest angle-of-incidence intervals or the greatest variation of angle of incidence. In the context of this application, the angle-of-incidence interval or variation of angles of incidence is understood to be that angular range in degrees between the maximum and minimum angles of incidence which the coating of the mirror has to ensure for a given distance from the optical axis on account of the requirements of the optical design.

The optical data of the projection objective in accordance with table 1 are applicable in the case of the mirror 1 on which FIG. 4 is based. In this case, the aspheres Z(h) of the mirrors 1, 11 of the optical design are given as a function of the distance h between an asphere point of the individual mirror and the optical axis, indicated in the units [mm], in accordance with the asphere equation:

$$Z(h) = (\text{rho}*h^2)/(1+[1-(1+k_y)*(\text{rho}*h)^2]^{0.5}) + c_1*h^4 c_2*h^6 c_3*h^8 c_4*h^{10} c_5*h^{12} c_6*h^{14}$$

with the radius R=1/rho of the mirror and the parameters $k_y$, $c_1$, $c_2$, $c_3$, $c_4$, $c_5$, and $c_6$. In this case, said parameters $c_n$ are normalized with regard to the unit [mm] in accordance with [$1/\text{mm}^{2n+2}$] in such a way as to result in the asphere Z(h) as a function of the distance h also in the unit [mm].

TABLE 1

Data of the optical design regarding the angles of incidence of the mirror 1 in FIG. 4 in accordance with the schematic illustration of the design on the basis of FIG. 2.

| Designation of the surface in accordance with FIG. 2 | Radius R in [mm] | Distance to the next surface in [mm] | Asphere parameters with the unit [$1/\text{mm}^{2n+2}$] for $c_n$ |
|---|---|---|---|
| Object plane 5 | infinity | 697.657821079643 | |
| 1st mirror 11 | −3060.189398512395 | 494.429629463009 | |
| | | | $k_y = 0.00000000000000\text{E}+00$ |
| | | | $c_1 = 8.46747658600840\text{E}-10$ |
| | | | $c_2 = -6.38829035308911\text{E}-15$ |
| | | | $c_3 = 2.99297298249148\text{E}-20$ |
| | | | $c_4 = 4.89923345704506\text{E}-25$ |
| | | | $c_5 = -2.62811636654902\text{E}-29$ |
| | | | $c_6 = 4.29534493103729\text{E}-34$ |
| 2nd mirror 11 -- diaphragm | −1237.831140064837 | 716.403660000000 | |
| | | | $k_y = 3.05349335818189\text{E}+00$ |
| | | | $c_1 = 3.01069673080653\text{E}-10$ |
| | | | $c_2 = 3.09241275151742\text{E}-16$ |
| | | | $c_3 = 2.71009214786939\text{E}-20$ |
| | | | $c_4 = -5.04344434347305\text{E}-24$ |
| | | | $c_5 = 4.22176379615477\text{E}-28$ |
| | | | $c_6 = -1.41314914233702\text{E}-32$ |
| 3rd mirror 11 | 318.277985359899 | 218.770165786534 | |
| | | | $k_y = -7.80082610035452\text{E}-01$ |
| | | | $c_1 = 3.12944645776932\text{E}-10$ |
| | | | $c_2 = -1.32434614339199\text{E}-14$ |
| | | | $c_3 = 9.56932396033676\text{E}-19$ |
| | | | $c_4 = -3.13223523243916\text{E}-23$ |
| | | | $c_5 = 4.73030659773901\text{E}-28$ |
| | | | $c_6 = -2.70237216494288\text{E}-33$ |
| 4th mirror 11 | −513.327287349838 | 892.674538915941 | |
| | | | $k_y = -1.05007411819774\text{E}-01$ |
| | | | $c_1 = -1.33355977877878\text{E}-12$ |
| | | | $c_2 = -1.71866358951357\text{E}-16$ |
| | | | $c_3 = 6.69985430179187\text{E}-22$ |
| | | | $c_4 = 5.40777151247246\text{E}-27$ |
| | | | $c_5 = -1.16662974927332\text{E}-31$ |
| | | | $c_6 = 4.19572235940121\text{E}-37$ |
| Mirror 1 | 378.800274177878 | 285.840721874570 | |
| | | | $k_y = 0.00000000000000\text{E}+00$ |
| | | | $c_1 = 9.27754883183223\text{E}-09$ |
| | | | $c_2 = 5.96362556484499\text{E}-13$ |
| | | | $c_3 = 1.56339572303953\text{E}-17$ |
| | | | $c_4 = -1.41168321383233\text{E}-21$ |
| | | | $c_5 = 5.98677250336455\text{E}-25$ |
| | | | $c_6 = -6.30124060830317\text{E}-29$ |
| 5th mirror 11 | −367.938526548613 | 325.746354374172 | |
| | | | $k_y = 1.07407597789597\text{E}-01$ |
| | | | $c_1 = 3.87917960004046\text{E}-11$ |
| | | | $c_2 = -3.43420257078373\text{E}-17$ |
| | | | $c_3 = 2.26996395088275\text{E}-21$ |
| | | | $c_4 = -2.71360350994977\text{E}-25$ |
| | | | $c_5 = 9.23791176750829\text{E}-30$ |
| | | | $c_6 = -1.37746833100643\text{E}-34$ |
| Image plane 7 | infinity | | |

It can be discerned from FIG. 4 that maximum angles of incidence of 24° and interval lengths of the angle-of-incidence intervals of 11° occur at different locations of the mirror 1. Consequently, the layer arrangement of the mirror has to yield high reflectivity values at these different locations for different angles of incidence and different angle-of incidence intervals, since otherwise a high total transmission of the projection objective 2 cannot be ensured. In FIG. 4, a bar 23 is used to mark by way of example a specific radius where a specific distance of the locations of the mirror 1 having the associated maximum angle of incidence of approximately 21° and the associated angle-of-incidence interval having an interval length of 11° with respect to the optical axis. Said marked radius corresponds in FIG. 5 to the locations on the circle 23a—illustrated in dashed fashion—within the hatched region 20, which represents the optically utilized region 20 of the mirror 1.

Figure 5:
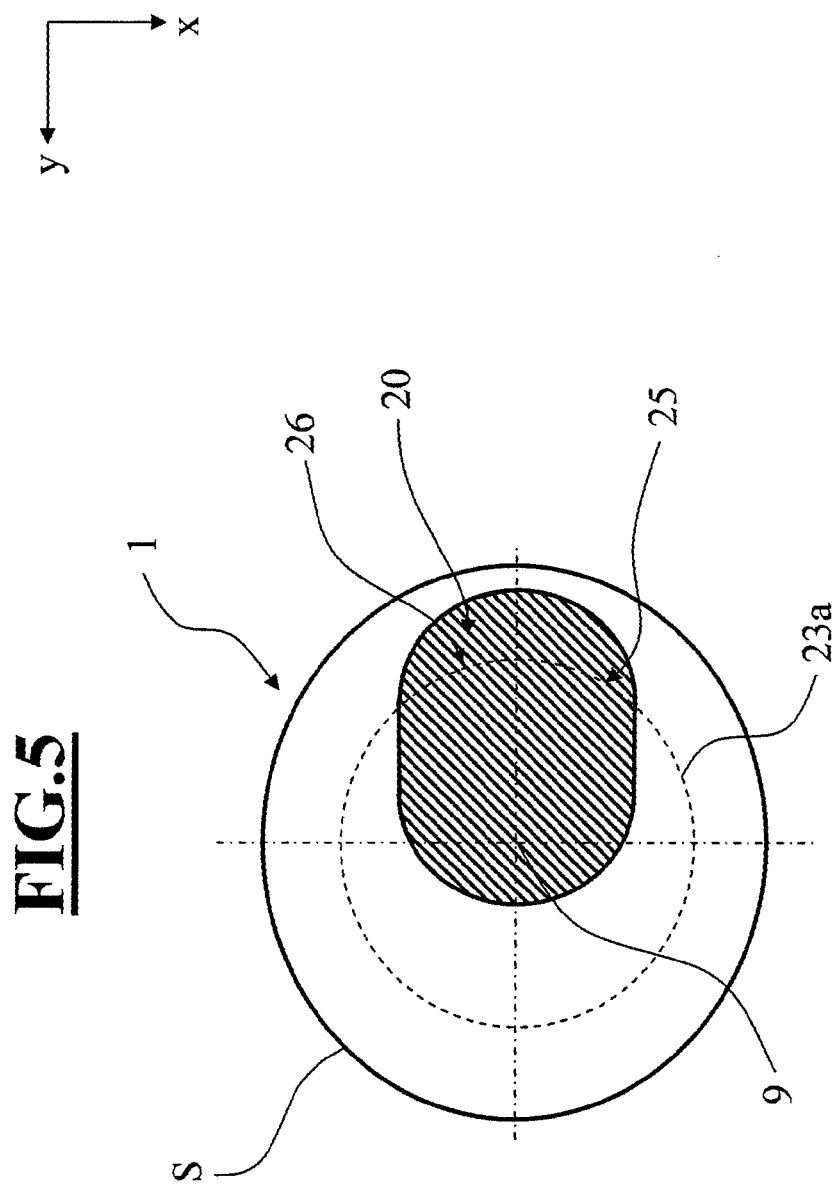
FIG. 5 shows a schematic illustration of the optically utilized region (hatched) on the substrate of a mirror according to the invention.

FIG. 5 shows the complete substrate S of the penultimate mirror 1 in the light path from the object plane to the image plane of the projection objective 2 from FIG. 2 as a solid circle centered with respect to the optical axis 9 in plan view. In this case, the optical axis 9 of the projection objective 2 corresponds to the axis 9 of symmetry of the substrate. Furthermore, in FIG. 5, the optically utilized region 20 of the mirror 1, said region being offset with respect to the optical axis, is depicted in hatched fashion and a circle 23a is depicted in dashed fashion. In this case, the part of the dashed circle 23a within the optically utilized region corresponds to the locations of the mirror 1 which are identified by the depicted bar 23 in FIG. 4. Consequently, the layer arrangement of the mirror 1 along the partial region of the dashed circle 23a within the optically utilized region 20, in accordance with the data from FIG. 4, has to ensure high reflectivity values both for a maximum angle of incidence at 21° and for a minimum angle of incidence of approximately 10°. In this case, the minimum angle of incidence of approximately 10° results from the maximum angle of incidence of 21° from FIG. 4 on account of the angle-of-incidence interval having the interval length of 11°. The locations on the dashed circle at which the two abovementioned extrema of the angles of incidence occur are emphasized in FIG. 5 by the tip of the arrow 26 for the angle of incidence of 10° and by the tip of the arrow 25 for the angle of incidence of 21°. Since a layer arrangement P cannot be varied locally over the locations of a substrate S without high technological outlay and layer arrangements are generally applied rotationally symmetrically with respect to the axis 9 of symmetry of the substrate, the layer arrangement P along the locations of the dashed circle 23a in FIG. 5 comprises one and the same layer arrangement P such as is shown in its basic construction in FIG. 1 and is explained in the form of specific exemplary embodiments with reference to FIGS. 7 to 9. In this case, it should be taken into consideration that a rotationally symmetrical coating of the substrate S with respect to the axis 9 of symmetry of the substrate S with the layer arrangement P has the effect that the strictly periodic sequence of the layers of the layer arrangement P is maintained at all locations of the mirror and only the thickness of the periods of the layer arrangement depending on the distance from the axis of symmetry requires a rotationally symmetrical profile over the substrate S. It is only in the exemplary embodiment of the layer arrangement regarding FIG. 6 that a layer arrangement having a displacement of the axis of symmetry of the layer arrangement with respect to the axis 9 of symmetry of the substrate S is indicated for comparison. In this case, too, the strictly periodic sequence of the layer arrangement is maintained at all locations of the mirror 1. Only the thickness of the layer arrangement is no longer constant in this exemplary embodiment regarding FIG. 6 in comparison with the other exemplary embodiments along the dashed circle 23a in FIG. 5 on account of the displacement of the axis of symmetry of the layer arrangement with respect to the axis 9 of symmetry of the substrate.

Figure 6:
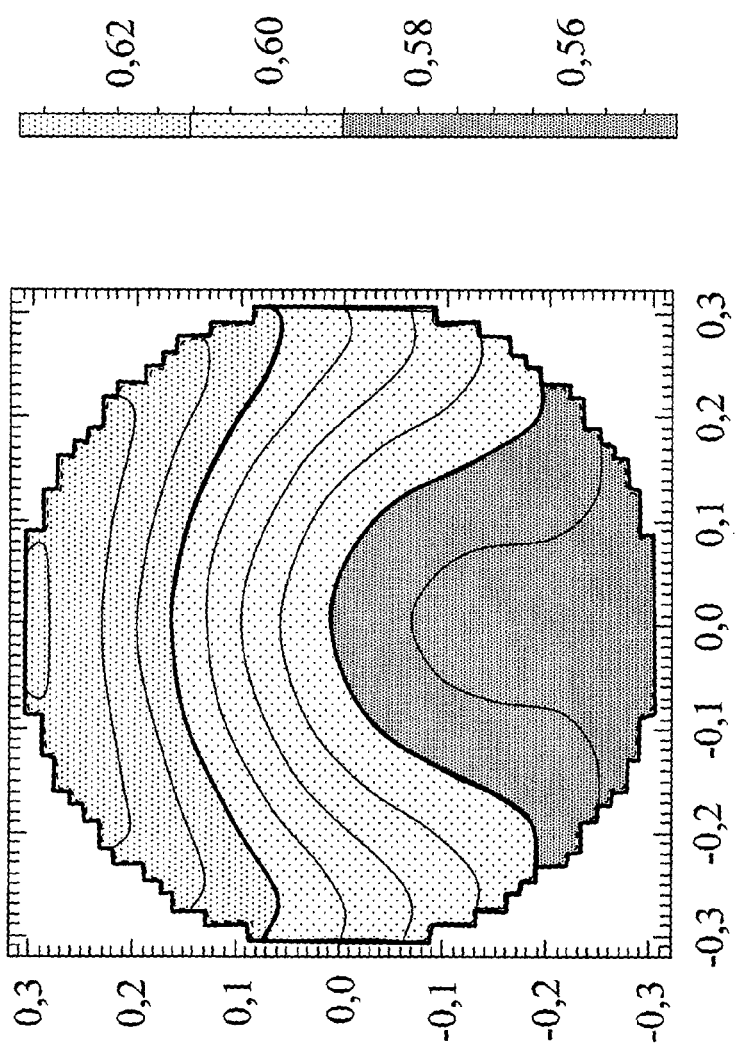
FIG. 6 shows a schematic illustration of the reflectivity values of a mirror in accordance with a first exemplary embodiment over the exit pupil of the projection objective for the central image field point.

FIG. 6 shows the reflectivity of a mirror 1 according to the invention illustrated over the exit pupil of the central field point of the projection objective 2. In this case, the mirror 1 is situated in the light path from the object plane 5 to the image plane 7 of the projection objective 2 in accordance with FIG. 2 at a penultimate position of the mirrors 1, 11 of the projection objective 2 before the image plane 7. In this case, within the optical region shown in hatched fashion in FIG. 5, the mirror 1 has to ensure the angles of incidence illustrated in FIG. 4. These angles of incidence are defined on the basis of the position of the mirror 1 within the optical design of the projection objective 2 in accordance with table 1.

The mirror 1 according to the invention regarding FIG. 6 comprises a layer arrangement P formed from 23 periods of an individual period comprising 5.4348 nm Si, 0.4 nm $B_4C$, 3.0701 nm Ru and 0.4 nm $B_4C$. Furthermore, the mirror 1 comprises a covering layer system C, which is formed from 5.4348 nm Si, 0.4 nm $B_4C$ and 3.0701 nm Ru and terminates the layer arrangement P.

Furthermore, the individual layers of the layer arrangement of the mirror 1 according to the invention, in order to obtain the reflectivity values illustrated in FIG. 6, along the mirror surface, are varied in their thickness $D_{ES}$ in accordance with the system of coordinates in FIG. 5 on the basis of the following modulation function:

$$D_{ES}(x,y)=D_{ES0}*(K1+K2*x^2+K4*(y-K3)^2)$$

with the above-indicated thickness $D_{ES0}$ of an individual layer of the layer arrangement in [nm] and $K1=0.920177068719E+000$, $K2=-0.262733379546E-005/mm^2$, $K3=0.203407200000E+003$ mm, and $K4=-0.262733379546E-005/mm^2$.

Consequently, the thickness of the layer arrangement P regarding the exemplary embodiment regarding FIG. 6 has a parabolic profile over the substrate S in which the thickness of the layer arrangement P decreases toward the edge of the substrate S and in which the axis of symmetry of the layer arrangement P is displaced by approximately 203 mm in the Y direction with respect to the axis 9 of symmetry of the substrate S.

In FIG. 6, the numerical value 0.3 is assigned to the edge of the exit pupil for orientation purposes. Furthermore, the regions of the exit pupil having different reflectivity values are illustrated with different degrees of dotting in FIG. 6, the reflectivity values in FIG. 6 being between 0.54 or 54% and 0.64 or 64%. Consequently, it can be discerned in FIG. 6 that over all the locations of the exit pupil a reflectivity of greater than 50% is realized for the layer design specified. In this case, it should be taken into consideration that the layer design ensures these reflectivity values for the different angles of incidence and the different angle-of-incidence intervals in FIG. 4 since, in the consideration of the reflectivity of the mirror 1 in the exit pupil of the central field point of the projection objection 2, said angles of incidence and angle-of-incidence intervals are included in the illustration of the reflectivity in FIG. 6. In this respect, the layer design specified with regard to FIG. 6 ensures reflectivity values of greater than 50% for angles of incidence of up to 24°. Furthermore, the layer design specified ensures reflectivity values of greater than 50% for angle-of-incidence intervals having interval lengths of up to 11°.

The reflectivity values illustrated in FIGS. 6 to 9 were calculated using the complex refractive indices n=n−i*k indicated in table 2 for the utilized materials at the wavelength of 13.5 nm. In this case, it should be taken into consideration that reflectivity values of real mirrors can turn out to be lower than the theoretical reflectivity values illustrated in FIGS. 6 to 9, since in particular the refractive indices of real thin layers can deviate from the literature values mentioned in table 2.

TABLE 2

Employed refractive indices n = n − i*k for 13.5 nm

| Material | Chemical | Layer design | N | k | k/n |
|---|---|---|---|---|---|
| Substrate | | | 0.973713 | 0.0129764 | 0.0133 |
| Silicon | Si | Si | 0.999362 | 0.00171609 | 0.0053 |
| Boron carbide | $B_4C$ | B | 0.963773 | 0.0051462 | 0.0070 |
| Ruthenium | Ru | Ru | 0.889034 | 0.0171107 | 0.0192 |
| Vacuum | | | 1 | 0 | 0.0000 |

Figure 7:
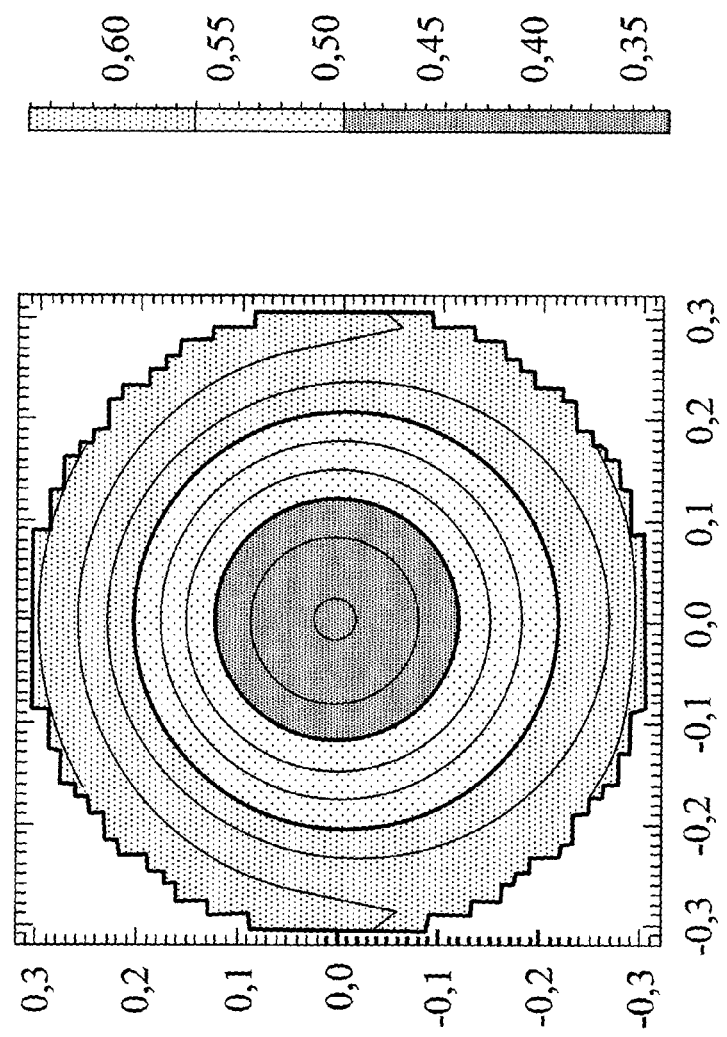
FIG. 7 shows a schematic illustration of the reflectivity values of a mirror in accordance with a second exemplary embodiment over the exit pupil of the projection objective for the central image field point.

FIG. 7 shows, in a manner corresponding to FIG. 6, the reflectivity of a further mirror according to the invention illustrated over the exit pupil of the central field point of the projection objective 2, in which the layer arrangement P is formed from 25 periods of an individual period comprising 6.615 nm Si, 0.4 nm $B_4C$, 4.3691 nm Ru and 0.4 nm $B_4C$, and in which a covering layer system C from 6.7949 nm Si, 0.4 nm $B_4C$ and 3.5 nm Ru terminates the layer arrangement.

Furthermore, the individual layers of the layer arrangement of the mirror 1 according to the invention, in order to obtain the reflectivity values illustrated in FIG. 7, along the mirror surface, are varied in their thickness $D_{ES}$ in accordance with the system of coordinates in FIG. 5 on the basis of the modulation function indicated above. In this case, the following values hold true for the parameters K1 to K4 of the layer arrangement P regarding the exemplary embodiment regarding FIG. 7:

$K1=0.651952190741E+000$, $K2=-0.201085612884E-004/mm^2$, $K3=0.000000000000E+000$ mm, and $K4=-0.201085612884E-004/mm^2$ Consequently, the thickness of the layer arrangement P regarding the exemplary embodiment regarding FIG. 7 has a parabolic profile over the substrate S in which the thickness of the layer arrangement P decreases toward the edge of the substrate S and in which the axis of symmetry of the layer arrangement P coincides with the axis 9 of symmetry of the substrate S.

It can be discerned in FIG. 7 that over all locations of the exit pupil a reflectivity of greater than 30% is realized for the layer design specified. In this case, it should be noted that the edge—important for imaging theory—of the pupil in FIG. 7 has a reflectivity of greater than 50% in the same way as the exemplary embodiment regarding FIG. 6. In this respect, the layer design specified with regard to FIG. 7 ensures reflectivity values of greater than 30% for angles of incidence of up to 24°. Furthermore, the layer design specified ensures reflectivity values of greater than 30% for angle-of-incidence intervals having an interval length of up to 11°.

Figure 8:
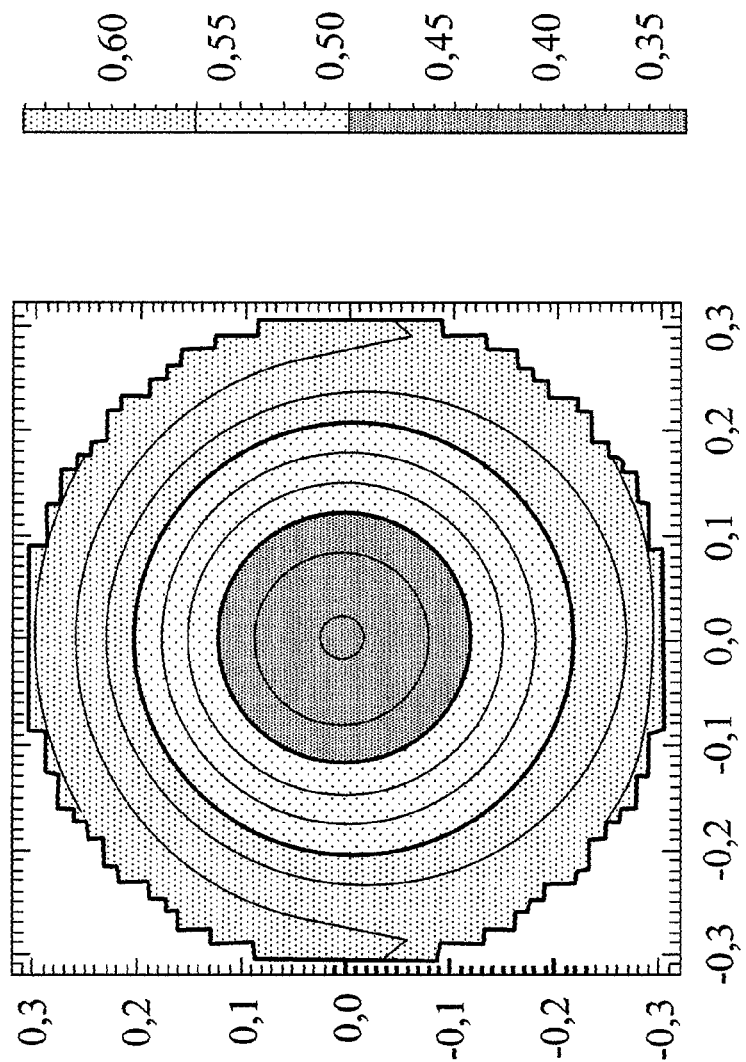
FIG. 8 shows a schematic illustration of the reflectivity values of a mirror in accordance with a third exemplary embodiment over the exit pupil of the projection objective for the central image field point.

FIG. 8 shows, in a manner corresponding to FIG. 6, the reflectivity of a further mirror according to the invention illustrated over the exit pupil of the central field point of the projection objective 2, in which the layer arrangement P is formed from 25 periods of an individual period comprising 6.6203 nm Si, 0.4 nm $B_4C$, 4.3688 nm Ru and 0.4 nm $B_4C$, and in which a covering layer system C from 6.6203 nm Si, 0.4 nm $B_4C$ and 3.5407 nm Ru terminates the layer arrangement.

Furthermore, the individual layers of the layer arrangement of the mirror 1 according to the invention, in order to obtain the reflectivity values illustrated in FIG. 8, along the mirror surface, are varied in their thickness $D_{ES}$ in accordance with the system of coordinates in FIG. 5 on the basis of the modulation function indicated above. In this case, the following values hold true for the parameters K1 to K4 of the layer arrangement P regarding the exemplary embodiment regarding FIG. 8:

$K1=0.651948722164E+000$, $K2=-0.201333506323E-004/mm^2$, $K3=0.000000000000E+000$ mm, and $K4=-0.201333506323E-004/mm^2$ Consequently, the thickness of the layer arrangement P regarding the exemplary embodiment regarding FIG. 8 has a parabolic profile over the substrate S in which the thickness of the layer arrangement P decreases toward the edge of the substrate S and in which the axis of symmetry of the layer arrangement P coincides with the axis 9 of symmetry of the substrate S.

It can be discerned in FIG. 8 that over all locations of the exit pupil a reflectivity of greater than 30% is realized for the layer design specified. In this case, it should be noted that the edge—important for imaging theory—of the pupil in FIG. 8 has a reflectivity of greater than 50% in the same way as the exemplary embodiment regarding FIG. 6. In this respect, the layer design specified with regard to FIG. 8 ensures reflectivity values of greater than 30% for angles of incidence of up to 24°. Furthermore, the layer design specified ensures reflectivity values of greater than 30% for angle-of-incidence intervals having an interval length of up to 11°.

Figure 9:
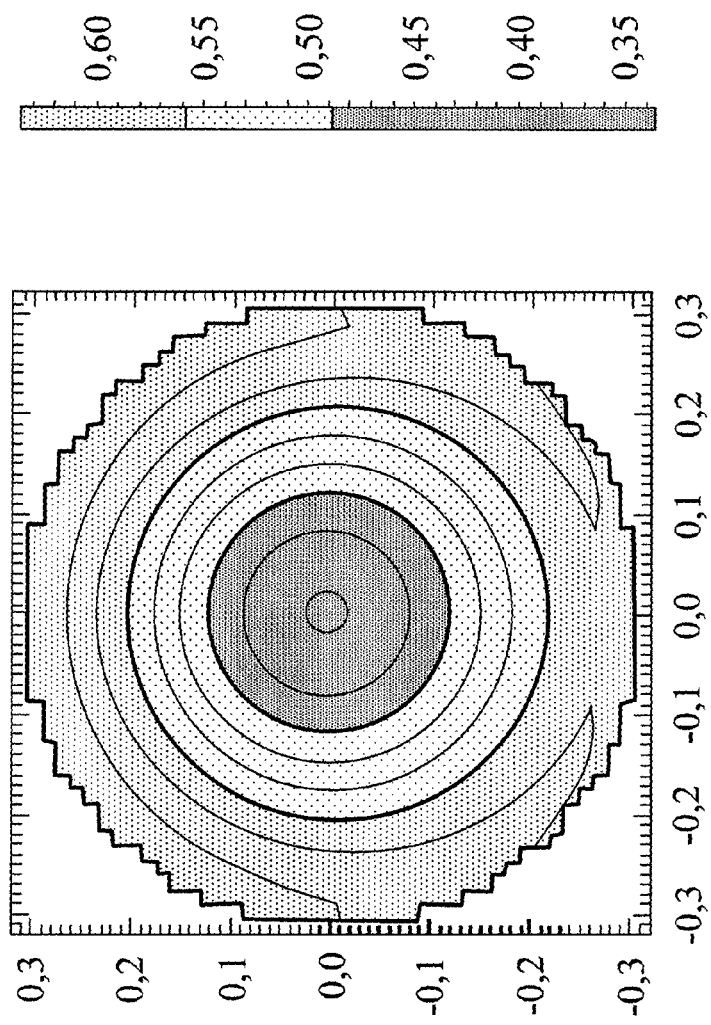
FIG. 9 shows a schematic illustration of the reflectivity values of a mirror in accordance with a fourth exemplary embodiment over the exit pupil of the projection objective for the central image field point.

FIG. 9 shows, in a manner corresponding to FIG. 6, the reflectivity of a further mirror according to the invention illustrated over the exit pupil of the central field point of the projection objective 2, in which the layer arrangement P is formed from 23 periods of an individual period comprising 4.1755 nm Si, 0.4 nm $B_4C$, 2.6914 nm Ru and 0.4 nm $B_4C$, and in which a covering layer system C from 4.1755 nm Si, 0.4 nm $B_4C$ and 2.6914 nm Ru terminates the layer arrangement.

Furthermore, the individual layers of the layer arrangement of the mirror 1 according to the invention, in order to obtain the reflectivity values illustrated in FIG. 9, along the mirror surface, are varied in their thickness $D_{ES}$ in accordance with the system of coordinates in FIG. 5 on the basis of the modulation function indicated above. In this case, the following values hold true for the parameters K1 to K4 of the layer arrangement P regarding the exemplary embodiment regarding FIG. 9:

$K1=0.100032068804E+001$, $K2=-0.309146083180E-004/mm^2$, $K3=0.000000000000E+000$ mm, and $K4=-0.309146083180E-004/mm^2$ Consequently, the thickness of the layer arrangement P regarding the exemplary embodiment regarding FIG. 9 has a parabolic profile over the substrate S in which the thickness of the layer arrangement P decreases toward the edge of the substrate S and in which the axis of symmetry of the layer arrangement P coincides with the axis 9 of symmetry of the substrate S.

It can be discerned in FIG. 9 that over all locations of the exit pupil a reflectivity of greater than 30% is realized for the layer design specified. In this case, it should be noted that the edge—important for imaging theory—of the pupil in FIG. 9 has a reflectivity of greater than 50% in the same way as the exemplary embodiment regarding FIG. 6. In this respect, the layer design specified with regard to FIG. 9 ensures reflectivity values of greater than 30% for angles of incidence of up to 24°. Furthermore, the layer design specified ensures reflectivity values of greater than 30% for angle-of-incidence intervals having an interval length of up to 11°.

The above description of the preferred embodiments has been given by way of example. From the disclosure given, those skilled in the art will not only understand the present invention and its attendant advantages, but will also find apparent various changes and modifications to the structures disclosed. The applicant seeks, therefore, to cover all such changes and modifications as fall within the spirit and scope of the invention, as defined by the appended claims, and equivalents thereof.

The invention claimed is:

1. A mirror comprising:
   a layer arrangement applied on a substrate and configured for an extreme-ultraviolet wavelength range of light, said layer arrangement comprising:
      at least two periods of a periodic sequence, wherein each period of the periodic sequence consists of a silicon layer, a ruthenium layer, and at least one barrier layer composed of $B_4C$ having a thickness of greater than 0.35 nm and situated between the silicon layer and the ruthenium layer; and
      at least one barrier layer composed of $B_4C$ having a thickness of greater than 0.35 nm and situated between the at least two periods.

2. The mirror as claimed in claim 1, wherein the barrier layer situated between the silicon layer and the ruthenium layer has a thickness of less than 1 nm.

3. The mirror as claimed in claim 1, wherein the barrier layer situated between the silicon later and the ruthenium layer has a thickness of between 0.4 nm and 0.6 nm.

4. The mirror as claimed in claim 1, wherein each of the silicon layers has a thickness of between 4 nm and 7 nm and each of the ruthenium layers has a thickness of between 2.5 nm and 4.5 nm, and further comprising a covering layer system that terminates the layer arrangement of the mirror and comprises at least one layer composed of a chemically inert material.

5. The mirror as claimed in claim 1, having a reflectivity of more than 30% of the light at an angle of incidence of 24° and a wavelength of between 13.3 nm and 13.7 nm.

6. The mirror as claimed in claim 1, having a reflectivity of more than 30% of the light at an angle of incidence of between 0° and 24° and a wavelength of between 13.3 nm and 13.7 nm.

7. The mirror as claimed in claim 1, having a reflectivity of more than 30% of the light at an angle-of-incidence interval having an interval length of between 0° and 11° and a wavelength of between 13.3 nm and 13.7 nm.

8. A projection objective for microlithography comprising a mirror as claimed in claim 1.

9. The projection objective for microlithography as claimed in claim 8, further comprising an exit pupil and defining an image plane, wherein the mirror has a reflectivity of more than 30% over the exit pupil of the central image point in the image plane of the projection objective.

10. The mirror as claimed in claim 1, further comprising a covering layer applied on the layer arrangement on a side of the mirror most distant from the substrate.

11. The mirror as claimed in claim 10, wherein the covering layer consists of:
   two further layers composed respectively of silicon and ruthenium, and
   one barrier layer composed of $B_4C$ having a thickness of between 0.4 nm and 0.6 nm, and situated between the further layers.

\* \* \* \* \*